(12) United States Patent
Shemirani (10) Patent No.: US 11,445,626 B2
(45) Date of Patent: Sep. 13, 2022

(54) POWER OUTLET MODULE INCLUDING USB PLUG IN LOCATION OTHER THAN OUTLET FACE

(71) Applicant: Hesam Shemirani, San Jose, CA (US)

(72) Inventor: Hesam Shemirani, San Jose, CA (US)

( * ) Notice: Subject to any disclaimer, the term of this patent is extended or adjusted under 35 U.S.C. 154(b) by 0 days.

(21) Appl. No.: 15/685,901

(22) Filed: Aug. 24, 2017

(65) Prior Publication Data

US 2018/0359873 A1 Dec. 13, 2018

Related U.S. Application Data

(60) Provisional application No. 62/517,893, filed on Jun. 10, 2017.

(51) Int. Cl.
| | |
|---|---|
| *H02J 7/02* | (2016.01) |
| *H02J 50/12* | (2016.01) |
| *H02J 7/00* | (2006.01) |
| *H01R 25/00* | (2006.01) |
| *H05K 5/02* | (2006.01) |
| *H01R 27/02* | (2006.01) |
| *H01R 31/06* | (2006.01) |
| *H01R 24/76* | (2011.01) |
| *H01R 24/62* | (2011.01) |
| *H01R 24/78* | (2011.01) |
| *H01R 13/66* | (2006.01) |

(52) U.S. Cl.
CPC ........... *H05K 5/0278* (2013.01); *H01R 24/62* (2013.01); *H01R 24/76* (2013.01); *H01R 24/78* (2013.01); *H01R 27/02* (2013.01); *H01R 31/06* (2013.01); *H01R 13/6675* (2013.01); *H02J 7/00* (2013.01); *H04B 2203/5454* (2013.01)

(58) Field of Classification Search
CPC .................................................... H01R 25/006
USPC .................................................. 439/373, 535
See application file for complete search history.

(56) References Cited

U.S. PATENT DOCUMENTS

| | | | | |
|---|---|---|---|---|
| 6,793,524 | B2* | 9/2004 | Clark | H01R 13/518 |
| | | | | 439/536 |
| 7,265,291 | B1* | 9/2007 | Gorman | H02G 3/14 |
| | | | | 439/536 |
| 8,197,260 | B2* | 6/2012 | Wadsworth | H01R 31/065 |
| | | | | 439/13 |
| 8,277,254 | B2* | 10/2012 | Yamamoto | H01R 25/006 |
| | | | | 398/140 |
| 10,063,021 | B1* | 8/2018 | Lipke | H01R 13/719 |
| 10,804,739 | B2* | 10/2020 | Makwinski | H02J 50/90 |
| 2003/0236010 | A1* | 12/2003 | Gorman | H01R 4/44 |
| | | | | 439/107 |
| 2013/0056259 | A1* | 3/2013 | Lettkeman | H02G 3/04 |
| | | | | 174/505 |

(Continued)

*Primary Examiner* — Abdullah A Riyami
*Assistant Examiner* — Thang H Nguyen
(74) *Attorney, Agent, or Firm* — Perkins Coie LLP; Colin Fowler; Louis Yang (57) ABSTRACT

Disclosed is a USB adaptor device comprising a wall outlet module or electrical control device, having a USB connector port positioned in the rear or on the side of the device, facing the interior of the wall when installed. The USB adaptor includes a 5v power output, for use in wiring of any office or home in order to enable devices mounted on a wall. The USB adaptor device includes electrical devices such as outlets, switches, and dimmers. The USB adaptor device includes a step down transformer in order to reduce the power from the source to 5v.

20 Claims, 5 Drawing Sheets

(56) References Cited

U.S. PATENT DOCUMENTS

| | | | | |
|---|---|---|---|---|
| 2013/0260613 | A1* | 10/2013 | Misener | H01R 27/02 |
| | | | | 439/653 |
| 2013/0333940 | A1* | 12/2013 | Stencil | H02G 3/18 |
| | | | | 174/503 |
| 2014/0030910 | A1* | 1/2014 | Carpanzano | H01R 13/74 |
| | | | | 439/501 |
| 2014/0132084 | A1* | 5/2014 | Pham | H01R 24/78 |
| | | | | 307/140 |
| 2016/0111878 | A1* | 4/2016 | Qureshi | H01R 24/30 |
| | | | | 29/622 |
| 2017/0025886 | A1* | 1/2017 | Rohmer | H02J 7/0044 |
| 2017/0141505 | A1* | 5/2017 | Forti | H01R 25/006 |
| 2017/0187155 | A1* | 6/2017 | Jansen | H05K 5/0286 |
| 2017/0193793 | A1* | 7/2017 | Ricciuti | G08B 25/08 |
| 2018/0034220 | A1* | 2/2018 | Forti | H01R 24/76 |
| 2018/0048093 | A1* | 2/2018 | Byrne | H01R 13/641 |
| 2018/0159283 | A1* | 6/2018 | Garcia | H01R 13/518 |
| 2018/0191113 | A1* | 7/2018 | Byrne | A47C 7/725 |
| 2018/0287425 | A1* | 10/2018 | Mortun | H02J 7/025 |
| 2018/0360197 | A1* | 12/2018 | Weaver | A45D 44/02 |
| 2019/0027953 | A1* | 1/2019 | Rohmer | H02J 50/12 |
| 2019/0280782 | A1* | 9/2019 | Elberbaum | H02G 3/12 |
| 2019/0312453 | A1* | 10/2019 | Rohmer | H02J 50/00 |
| 2020/0127451 | A1* | 4/2020 | Elberbaum | H04B 10/25 |

\* cited by examiner

POWER OUTLET MODULE INCLUDING USB PLUG IN LOCATION OTHER THAN OUTLET FACE

CROSS REFERENCE TO RELATED APPLICATION

This application claims priority to U.S. provisional application Ser. No. 62/517,893, filed Jun. 10, 2017, which is incorporated by reference in its entirety.

TECHNICAL FIELD

The present disclosure is related to wall outlets/electrical controls. More particularly, the disclosure is related to USB adaptor devices, including 5v power outlets that are connected to devices such as outlets, switches, and dimmers.

BACKGROUND

Universal serial bus (USB) adaptor devices are well-known in the art. USB adaptor devices operate as a common interface which enables communication between peripheral devices and a host device such as a personal computer (PC). Peripherals such as mice, keyboards, gamepads and joysticks, scanners, digital cameras, printers, external storage, "Internet of Things" devices, smart phones, tablets, and networking components, can be connected to a host device via USB adaptor devices. In recent years, USB has become the standard method to power various peripheral devices as listed above. The USB adaptor allows peripheral devices to connect, to communicate, to be charged, or to be powered by the host device. Presently, USB connector/adaptor devices are mounted on front facing wall outlets and/or floor outlets for connecting and/or charging of most types of peripheral electronic devices. USB connector/adaptor devices are also capable of connecting peripheral devices to a host device via cables without being mounted on a wall.

SUMMARY

Embodiments of the present disclosure include a low power adaptor device comprising a wall outlet module or electrical control device, having a low power connector port (e.g. a USB port) positioned in the rear or on the side of the device, facing the interior of the wall when installed.

The low power adaptor includes a 5v to 48v power output, for use in wiring of any office or home in order to enable devices to be mounted on a wall. The pre-wiring allows electrical wiring to be routed through the wall without having to design a custom wiring outlets and/or floor outlets available for charging of peripheral electronic devices. The USB adaptor device includes electrical devices such as outlets, switches, and dimmers. The USB adaptor device includes a step down transformer in order to reduce the power from the source (e.g. 110v) to 5v to 48v.

The USB power module includes one or more USB connector ports. The USB connector ports include type A, type B, type C, mini/micro connectors, a non-standard cable such as a reversible micro mini connector plug that can be connected to existing micro connectors, and proprietary connectors such as the HTC ExMicro USB port and connector, the Nokia Pop-Port connector, and the Apple Lightning-to-USB connector. Each of the USB connector ports are used for connecting, communicating, powering, and/or charging peripheral electronic devices, including cell phones, PDA's, MP3players, shavers, digital cameras, security cameras, sensors, home control devices, lights, and games using a USB-type plug in conjunction with the USB connector port.

In other embodiments, the USB outlet includes two data pins that are not "dead," in which case, the data in and data out pins may be connected. When the data pins are not "dead," a USB connector port may transfer data from a peripheral device to a host device where the host device is connected to the other end of the USB connector port. The host device is capable of processing transferred data. When the data pins are not "dead," the data pins may be connected to a wireless transceiver, which may be embedded inside the wall outlet module. The wireless transceiver allows a user to control the wall outlet module from a wireless device or devices on the same wireless network. The peripheral device is capable of processing data and receiving power through the USB connector port. The peripheral device may be powered and/or charged via USB connector ports without the need for additional cables or connectors. The peripheral device may be powered and/or charged without the need for a host such as a personal computer.

In some embodiments, the USB outlet includes two dead pins. The data in and data out pins may be disconnected. When the data pins are "dead," the USB power adaptor relates to a power adaptor. The power adaptor permits powering and/or charging peripheral devices. The power adaptor may not transfer or process data.

BRIEF DESCRIPTION OF THE DRAWINGS

These and other objects, features and characteristics of the present embodiments will become more apparent to those skilled in the art from a study of the following detailed description in conjunction with the appended claims and drawings, all of which form a part of this specification. While the accompanying drawings include illustrations of various embodiments, the drawings are not intended to limit the claimed subject matter.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

Large masses of wires and cables are generally unsightly in homes. To resolve this issue, some homes, offices, and other commercial establishments install wiring for fixtures within walls. This often requires an electrician or another with skill and technical knowhow of electrical wiring. This is a significant "barrier to entry" for some. In addition to the labor of running the wires through wall space, one also need know how create proper electrical connections, locate a locate mains power source, and in some cases step-down the power.

To reduce this barrier to entry, here disclosed, is an electrical outlet device that includes this wiring pre-configured such that internal wall wiring becomes "plug and play". The term "electrical outlet" or "outlet device" refers to devices that may have multiple functions and/or electrical controls. Devices includes are electrical plug outlets, dimmers, switches, or other suitable controls known in the art that are typically mounted within the structure of a wall.

Presently, USB connector/adaptor devices are mounted on front facing wall outlets and/or floor outlets for charging of most types of peripheral electronic devices. However, such USB connector/adaptor devices still require USB cables to be connected to the peripheral devices. Having USB connector port located in the rear and/or on the side of a wall outlet module diminishes the need for additional USB cables that may become unsightly.

Figure 1:
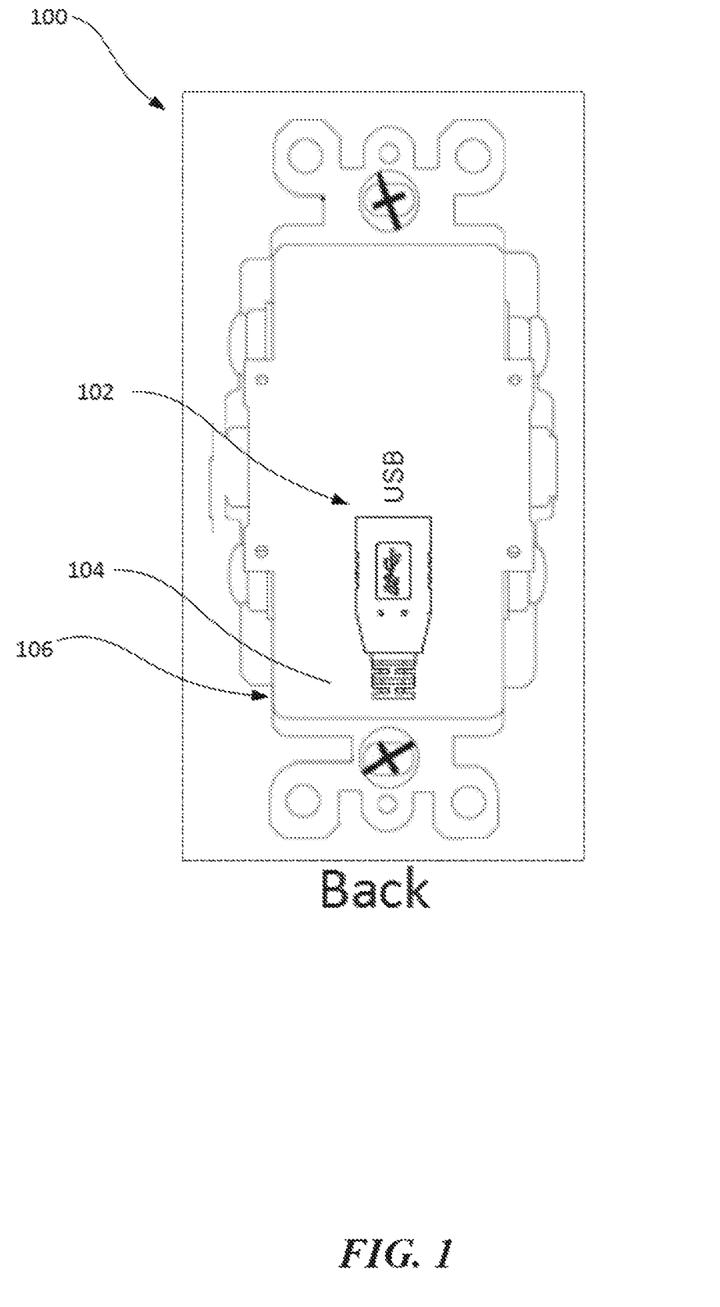
FIG. 1 is a rear perspective view of the USB power adaptor device of various embodiments showing a USB connector port embedded in the rear of a wall outlet module.

FIG. 1 is a rear perspective view of the low power adaptor device 100 of a present embodiment showing a USB connector port 102 embedded in the rear 104 inside a wall outlet module 106, according to an embodiment. The wall outlet module 106 is inserted in the interior of the wall, enabling peripheral devices to be embedded in the wall as well. The USB power adaptor device 100 includes a step down transformer that reduces the power from the source (e.g. 110v) to low power (5v to 48v). The USB power adaptor device 100 may include two dead pins, namely, the pins for data I/O may be disconnected. In some embodiments, the USB power adaptor device 100 may include live data pins, namely, the pins for data I/O may be connected for data connection and transfer. In other embodiments, the USB power adaptor device 100 may include two data pins that are recessed, allowing a peripheral device to power up first before establishing a data connection to minimize data error. Depending on the type of the device, the USB power adaptor 100 may include electrical plug outlets, dimmers, switches, or other suitable controls known in the art that are typically mounted within the structure of a wall.

The USB power adaptor device 100 may include one or more USB connector ports 102. The USB connector ports 102 include type A, type B, type C, mini/micro connectors, a non-standard cable such as a reversible micro mini connector plug that can be connected to existing micro connectors, and proprietary connectors such as the HTC ExMicro USB port and connector, the Nokia Pop-Port connector, and the Apple Lightning-to-USB connector. Each of the USB connector ports 102 are used for connecting, communicating, powering, and/or charging peripheral electronic devices, including cell phones, PDA's, MP3players, shavers, digital cameras, security cameras, sensors, home control devices, lights, and games using a USB-type plug in conjunction with the USB connector port 102. The peripheral electrical devices can be mounted in a position where their respective power receptacles face the interior of the wall. The USB connector ports 102 may transfer data from a peripheral device to a host device when the host device is connected to the other end of the USB connector port 102 and may include live data pins.

Figure 2:
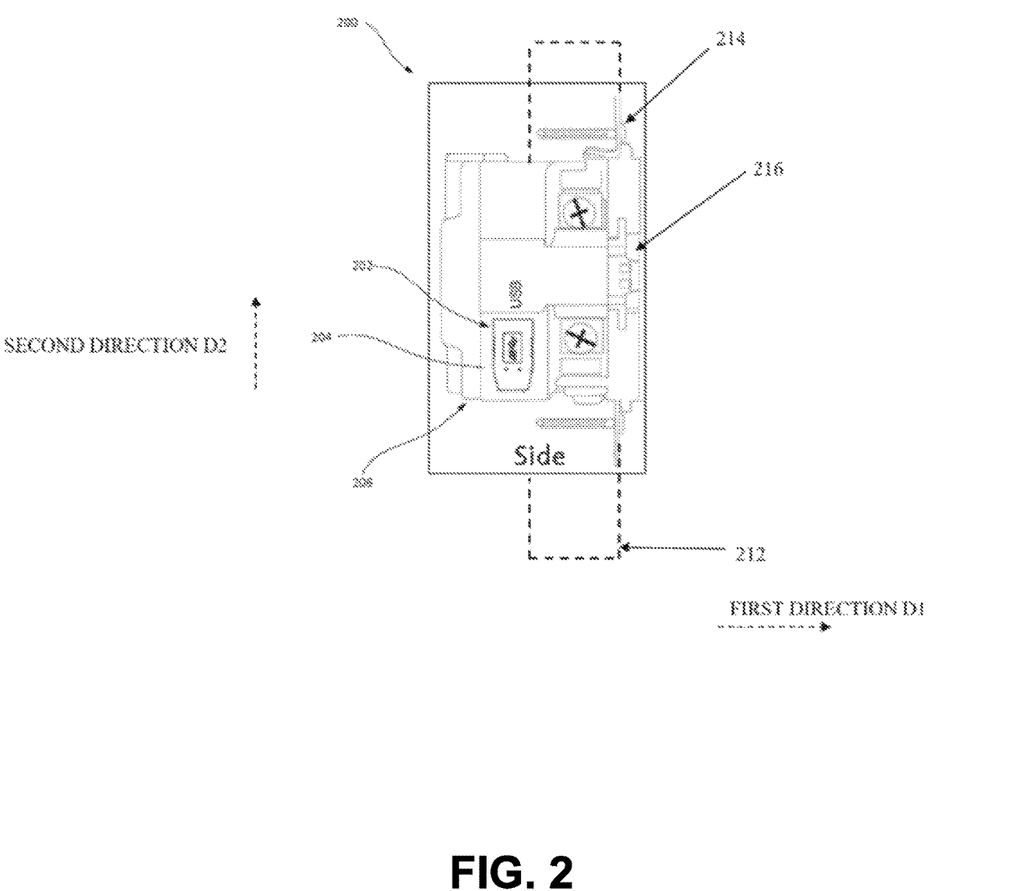
FIG. 2 is a side perspective view of the USB power adaptor device of various embodiments showing a USB connector port embedded on the side of a wall outlet module.

FIG. 2 is a side perspective view of the USB power adaptor device 200 of various embodiments showing a USB connector port 202 embedded on the side 204 of a wall outlet module 206. The USB power adaptor device 200 operates similarly as the USB power adaptor device 100 except the USB connector port 202 is located on the side of the wall outlet module 206. The USB power adaptor device 200 may be disposed in an interior of a wall 212. The USB power adaptor device 200 may include one or more wall fasteners 214 to fasten the device 200 to wall 212 and an electrical outlet 216 exposed in a first direction D1 exterior to the wall 212. The USB power adaptor device 200 and the USB connector port 202 may be disposed within an interior of the wall, and the USB connector port 202 may be directed in a second direction D2.

Figure 3:
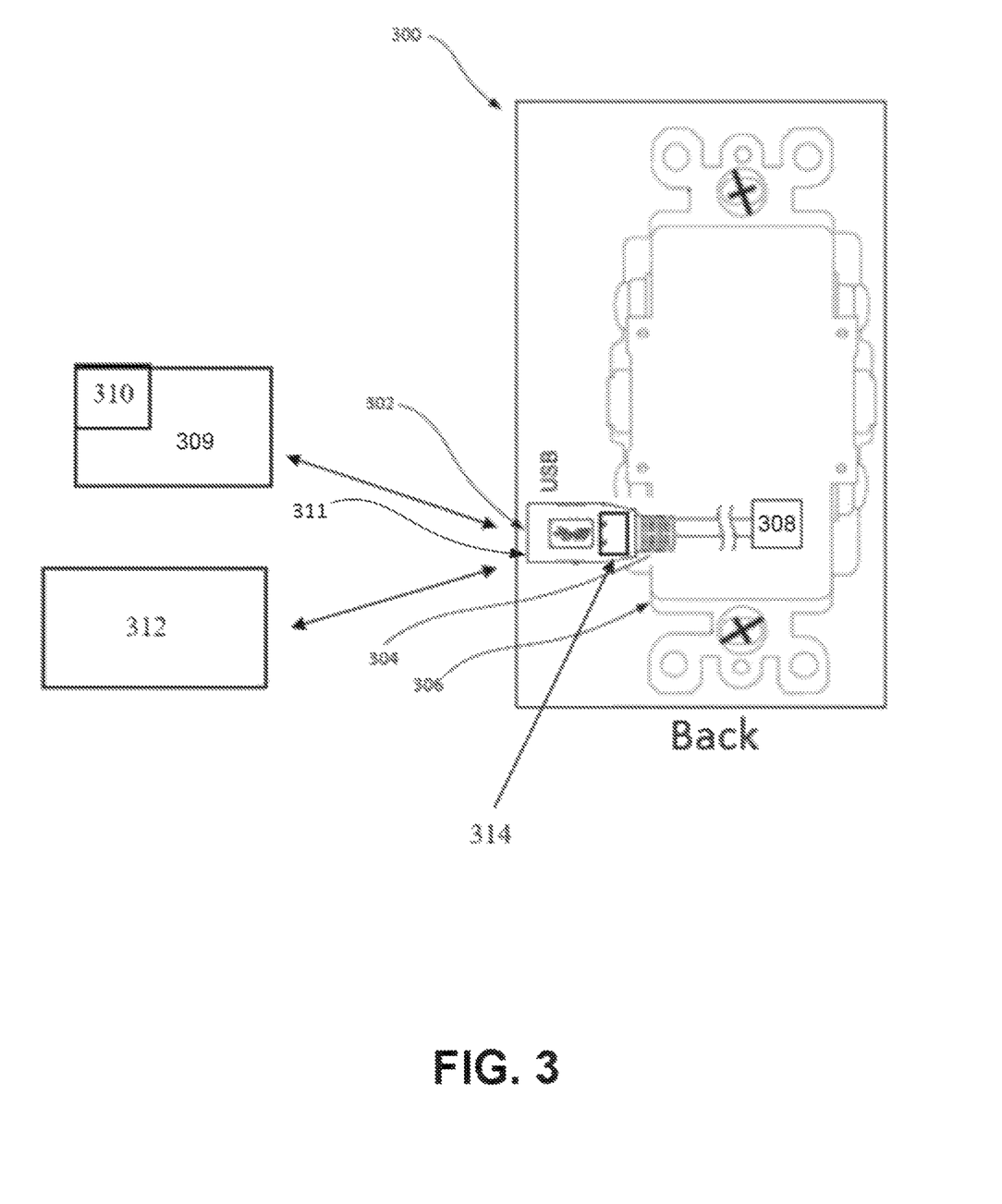
FIG. 3 is a rear perspective view of USB power adaptor device of various embodiments showing a USB cable coming out of the side of a wall outlet module.

FIG. 3 is a rear perspective view of the 5v or 5v USB power adaptor device 300 of the embodiment showing a USB cable 302 coming out of the side 304 of a wall outlet module 306. The USB power adaptor device 300 operates similarly as the USB power adaptor device 100 except the USB power adaptor device 300 comprises the USB cable 302 which comes out of the side 304 of the wall outlet module 306. A device 309 (e.g., outer plug or controls 502 in FIG. 5) may connect to USB cable 302 and communicate with other devices via wireless communicator 310 (e.g., wireless transceiver 508 of FIG. 5). Electrical meter 312 (e.g., analytics module 510 of FIG. 5) may connect to USB cable 302. Step-down transformer 314 (e.g., step-down transformer 506 of FIG. 5) may be included in the USB cable 302 and configured to lower an incoming electrical power to a lower electrical power (e.g., 5 volts) supplied at a low power socket 311.

Inclusion of the USB cable 302 prevents the need for additional cables by connecting peripheral devices directly to the wall outlet module 306. The USB cable 302 may be retractable by spring-loaded cord winder 308 to prevent tangling or cluttering of the cable. The spring-loaded cord winder 308 may be embedded inside the wall outlet module 306. The USB cable 302 may extend as a user pulls the cable out to plug the USB cable 302 to peripheral devices. The extended USB cable 302 is automatically retracted as the user inserts the wall outlet module 306 in the interior of the wall.

Figure 4:
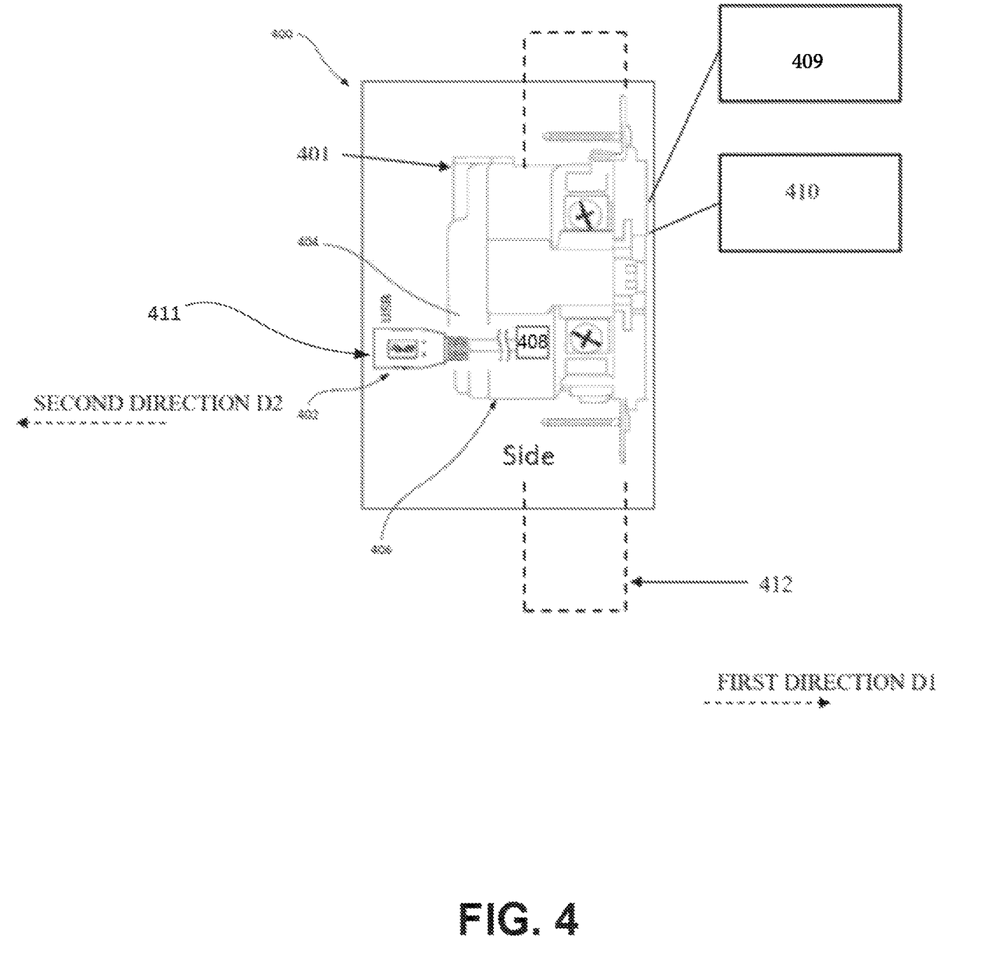
FIG. 4 is a side perspective view of the USB power adaptor device of an embodiment showing a USB cable coming out of the back of a wall outlet module.

FIG. 4 is a side perspective view of the 5v or 5v USB power adaptor device 400 of the embodiment showing a USB cable 402 coming out of the back 404 of a wall outlet module 406. The wall outlet module 406 is inserted in the interior of the wall. The USB power adaptor device 400 operates similarly as the USB power adaptor device 300 except the USB power adaptor device 400 comprises the USB cable 402 which comes out of the back 404 of the wall outlet module 406. Similar to the USB cable 302, the USB cable 402 is retractable and extendable via a cord winder 408. A dimmer 409 or switch 410 may be exposed from the housing 401 in a first direction D1 exterior of wall 412. The USB cable 402 connects the housing 401 to a low power socket 411.

Figure 5:
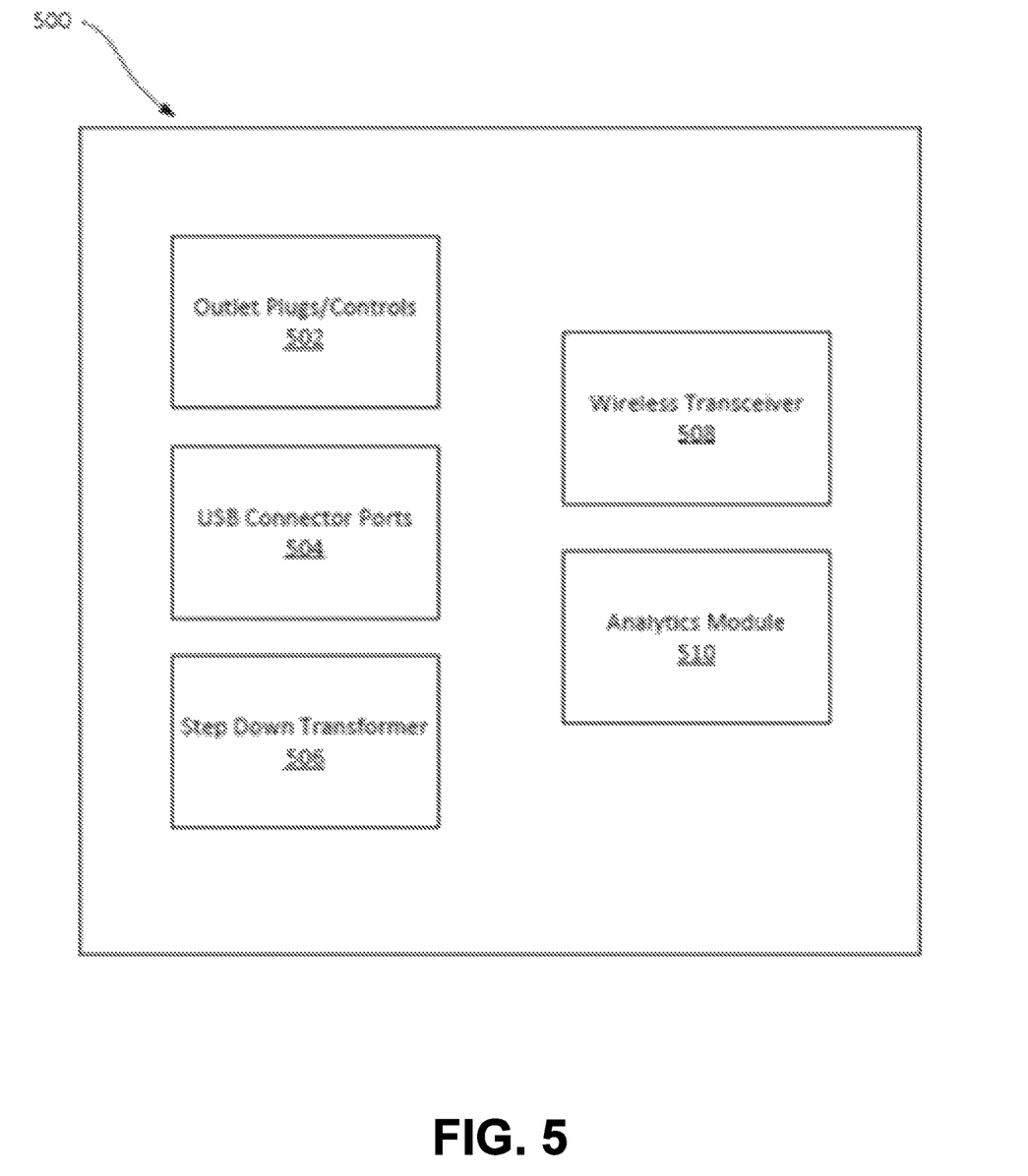
FIG. 5 is a block diagram illustrating components of the USB power adaptor device.

FIG. 5 is a block diagram illustrating components of the USB power adaptor device 500. The USB power adaptor device 500 comprises outer plug or controls 502, USB connector ports 504, a step down transformer 506, a wireless transceiver 508, and an analytic module 510.

Outer plugs or controls 502 may include peripheral electrical devices such as electrical plug outlets, dimmers, switches, or other suitable controls known in the art that are typically mounted within the structure of a wall.

The USB connector ports 504 include type A, type B, type C, mini/micro connectors, a non-standard cable such as a reversible micro mini connector plug that can be connected to existing micro connectors, and proprietary connectors such as the HTC ExMicro USB port and connector, the Nokia Pop-Port connector, and the Apple Lightning-to-USB connector.

The step down transformer 506 reduces a voltage from a source to 5v. A wireless transceiver 508 operates as a combination of a transmitter and a receiver. Having a wireless transceiver allows a user to control the wall outlet module from a wireless device or devices on the same wireless network. Wireless devices may include cellular telephones, mobile devices such as the Apple iPad, and home assistants such as the Amazon Echo or the Google Home.

An analytic module 510 comprises a circuit that monitors and tracks power usage from the wall outlet module. The analytic module 510 enables a user to measure how much power is being used by the peripheral devices connected to the USB connector ports 504. The measured data may be sent wirelessly to the user via the wireless transceiver 508.

The invention claimed is:

1. A wall electrical outlet comprising:
   a housing;
   an electrical socket exposed from the housing and directed in a first direction; and
   a low power socket exposed from the housing and directed in a second direction greater than ninety degrees from the first direction, the low power socket configured to be disposed within an interior of a wall and configured to supply 5 to 48 volts, and configured to electrically connect to a device physically separate from the wall electrical outlet and interior of the wall and prevent exposure of any cords of the device exterior to the wall.

2. The wall electrical outlet of claim 1,
   wherein the device is configured to mount on the interior of the wall and communicate with other devices via a wireless communicator, the device configured to draw power from the low power socket.

3. The wall electrical outlet of claim 1, wherein the device is any of:
   a security camera;
   a sensor;
   a home control device; or
   a light.

4. The wall electrical outlet of claim 1, further comprising:
   a dimmer exposed from the housing at the first direction.

5. The wall electrical outlet of claim 1, further comprising:
   a switch exposed from the housing at the first direction.

6. The wall electrical outlet of claim 1, further comprising:
   a wireless communicator configured to receive instructions over a local area network and transmit said instructions to the device connected to the low power socket.

7. The wall electrical outlet of claim 1, the low power socket further comprising:
   a cable connecting the low power socket to the housing.

8. The wall electrical outlet of claim 7, further comprising:
   a spring-loaded cable winder configured to wind up excess length of the cable.

9. A wall electrical outlet comprising:
   an electrical device exposed from a wall and directed in a first direction, wherein the electrical device is any of:
   an electrical socket;
   a dimmer; or
   an electrical switch;
   fastener mounts configured to affix the electrical device to a fixed structure disposed in an interior of the wall; and
   a universal serial bus (USB) socket electrically connected to the electrical device and positioned relative to the electrical device such that the USB socket is configured to be disposed in the interior of the wall in a second direction that is greater than ninety degrees from the first direction, the USB socket configured to electrically connect to a device physically separate to the wall electrical outlet and interior of the wall and prevent exposure of any cords of the device exterior to the wall.

10. The wall electrical outlet of claim 9,
    wherein the device is configured to mount to the interior of the wall and communicate with other devices via a wireless communicator, wherein the device draws power from the USB socket.

11. The wall electrical outlet of claim 9, wherein the device is any of:
    a security camera;
    a sensor;
    a home control device; or
    a light.

12. The wall electrical outlet of claim 9, further comprising:
    an electrical meter electrically connected to the low power socket and configured to receive data via the low power socket, the data indicating a use of electrical power through the electrical socket.

13. The wall electrical outlet of claim 9, further comprising:
    a wireless communicator configured to receive instructions over a local area network and transmit said instructions to devices connected to the USB socket.

14. The wall electrical outlet of claim 9, the USB socket further comprising:
    a cable connecting the USB socket to the wall electrical outlet.

15. The wall electrical outlet of claim 14, further comprising:
    a spring-loaded cable winder configured to wind up excess length of the cable.

16. A wall electrical outlet comprising:
    a housing configured to mount in an interior of a wall;
    an electrical socket exposed from the housing and the wall and directed in a first direction;
    a universal serial bus (USB) socket exposed from the housing in a second direction that is greater than ninety degrees from the first direction of the electrical socket and configured to be disposed in the interior of the wall, the USB socket configured to electrically connect to a device physically separate to the wall electrical outlet and interior of the wall, thereby preventing exposure of any cords of the device exterior to the wall; and
    a step-down transformer included within the USB socket, the step-down transformer configured to lower an electrical power received from the housing to a lower electrical power and provide the lower electrical power to the USB socket.

17. The wall electrical outlet of claim 16, wherein the device is configured to mount within the interior of the wall and communicate with other devices via a wireless communicator, wherein the device draws power from the USB socket.

18. The wall electrical outlet of claim 16, the USB socket further comprising:
   a cable connecting the USB socket to the wall electrical outlet.

19. The wall electrical outlet of claim 18, further comprising:
   a spring-loaded cable winder configured to wind up excess length of the cable.

20. The wall electrical outlet of claim 16, wherein the lower electrical power is five volts.

* * * * *